(12) United States Patent
Ke et al.

(10) Patent No.: US 9,282,679 B2
(45) Date of Patent: Mar. 8, 2016

(54) ELECTRONIC DEVICE WITH PHASE CHANGE MATERIAL MICROCAPSULE LAYER

(71) Applicants: Inventec (Pudong) Technology Corporation, Shanghai (CN); INVENTEC CORPORATION, Taipei (TW)

(72) Inventors: Huang-Cheng Ke, Taipei (TW); Hua-Feng Chen, Taipei (TW)

(73) Assignees: Inventec (Pudong) Technology Corporation, Shanghai (CN); INVENTEC CORPORATION, Taipei (TW)

( * ) Notice: Subject to any disclaimer, the term of this patent is extended or adjusted under 35 U.S.C. 154(b) by 113 days.

(21) Appl. No.: 14/230,007

(22) Filed: Mar. 31, 2014

(65) Prior Publication Data
US 2015/0156915 A1    Jun. 4, 2015

(30) Foreign Application Priority Data

Nov. 29, 2013   (CN) .......................... 2013 1 0628485

(51) Int. Cl.
  *H05K 7/20*   (2006.01)
(52) U.S. Cl.
  CPC ........ *H05K 7/20409* (2013.01); *H05K 7/20127* (2013.01); *H05K 7/20818* (2013.01); *H05K 7/20936* (2013.01)
(58) Field of Classification Search
  CPC .......... H05K 7/20009; H05K 7/20127; H05K 7/20136; H05K 7/20145; H05K 7/20154; H05K 7/20163; H05K 7/20618; H05K 7/20863; H05K 7/20818; H05K 7/20909; H05K 7/20936

USPC ................ 361/679, 679.48–679.51, 690–697
See application file for complete search history.

(56) References Cited

U.S. PATENT DOCUMENTS

| | | | | |
|---|---|---|---|---|
| 5,007,478 A | * | 4/1991 | Sengupta ............. | F28D 20/023 165/10 |
| 6,262,891 B1 | * | 7/2001 | Wickelmaier ...... | H05K 7/20909 165/80.4 |
| 6,972,950 B1 | * | 12/2005 | Wyatt .................. | G06F 1/203 165/104.33 |
| 7,245,485 B1 | * | 7/2007 | Morrell ............... | G06F 1/181 361/679.48 |
| 2006/0034055 A1 | * | 2/2006 | Mok ..................... | G06F 1/203 361/700 |
| 2011/0277489 A1 | * | 11/2011 | Schalla ................ | A47B 31/02 62/89 |

FOREIGN PATENT DOCUMENTS

| TW | 200401016 A | 1/2004 |
|---|---|---|
| TW | M444548 U | 1/2013 |

* cited by examiner

*Primary Examiner* — Adam B Dravininkas
(74) *Attorney, Agent, or Firm* — CKC & Partners Co., Ltd.

(57) ABSTRACT

An electronic device includes a case, a control module, a plurality of heat sinks and at least one airflow guiding structure. The case includes a bottom plate, a top plate, and at least one side plate. The bottom plate has a plurality of bottom holes for guiding air into the case. The top plate has a plurality of top holes for exhausting air in the case. The side plate connects the top plate and the bottom plate and has a plurality of side holes for exhausting air in the case. The control module is disposed in the case. The heat sinks are thermally connected to the control module. The airflow guiding structure is disposed between the heat sinks for guiding a part of the air in the case to the exterior of the case through the side holes.

9 Claims, 4 Drawing Sheets

ELECTRONIC DEVICE WITH PHASE CHANGE MATERIAL MICROCAPSULE LAYER

RELATED APPLICATIONS

This application claims priority to Chinese Application Ser. No. 201310628485.4, filed Nov. 29, 2013, which are herein incorporated by reference.

BACKGROUND

A thin Client, compared to a conventional personal computer, includes only a simple input module, and data and programs are stored in a server, such that computation function and storage function are conducted via the server. Therefore, the size of the thin client may be small.

In the thin client, often a fanless system is used to reduce the overall size of the thin client. In the fanless system, the cool air enters the interior of the case through the openings on the bottom plate of the case to cool the thin client, and then the hot air are exhausted through the openings on the top plate of the case. However, the cooling rate of the fanless system is still not enough, so the heat generated by the thin client may be accumulated in the top plate, resulting in the temperature of the top plate is higher than the standard.

SUMMARY

This disclosure provides fanless electronic device.

In one embodiment, an electronic device is provided. The electronic device includes a case, a control module, a plurality of heat sinks, and at least one airflow guiding structure. The case includes a bottom plate, a top plate, and at least one side plate. The bottom plate has a plurality of bottom holes for guiding air to an interior of the case. The top plate has a plurality of top holes for exhausting air inside the case. The side plate connects the top plate and the bottom plate and has a plurality of side holes for exhausting air inside the case. The control module is disposed in the case. The heat sinks are disposed in the case and are thermally connected to the control module. The airflow guiding structure is disposed between the heat sinks for guiding a part of the air inside the case to be exhausted through the side holes.

In one or more embodiments, the case is cubic, and a height of the case is greater than a length or a width of the case.

In one or more embodiments, the airflow guiding structure is a baffle.

In one or more embodiments, the airflow guiding structure has a first end and a second end opposite to the first end, the first end neighbors with the side plate, the second end is disposed between the heat sinks, and an angle between the airflow guiding structure and the side plate is from 10 to 80 degrees.

In one or more embodiments, the airflow guiding structure includes a body and a phase change material microcapsule layer, the body has a bottom surface facing the bottom plate, and the phase change material microcapsule layer totally covers or is coated on the bottom surface.

In one or more embodiments, the phase change material microcapsule layer includes a plurality of phase change material microcapsules, each of the phase change microcapsules includes a capsule shell and a capsule core, the material of the capsule shell is high polymers, and the material of the capsule core is a phase change material.

In one or more embodiments, a melting point of the capsule core is from 20° C. to 75° C.

In one or more embodiments, the melting point of the capsule core is from 35° C. to 55° C.

In one or more embodiments, the material of the capsule shell is a mixture of polycarbonate and glass fiber.

In one or more embodiments, the material of the capsule core is paraffins, alkanes, alcohols or acids.

By disposing the airflow guiding structure between the heat sinks, the part of the air in the interior of the case are guided to the exterior of the case through the side holes, so that not all the hot air is exhausted through the top holes. Therefore, a temperature of the top plate may not be higher than a standard.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. other instances, well-known structures and devices are schematically depicted in order to simplify the drawings.

Figure 1:
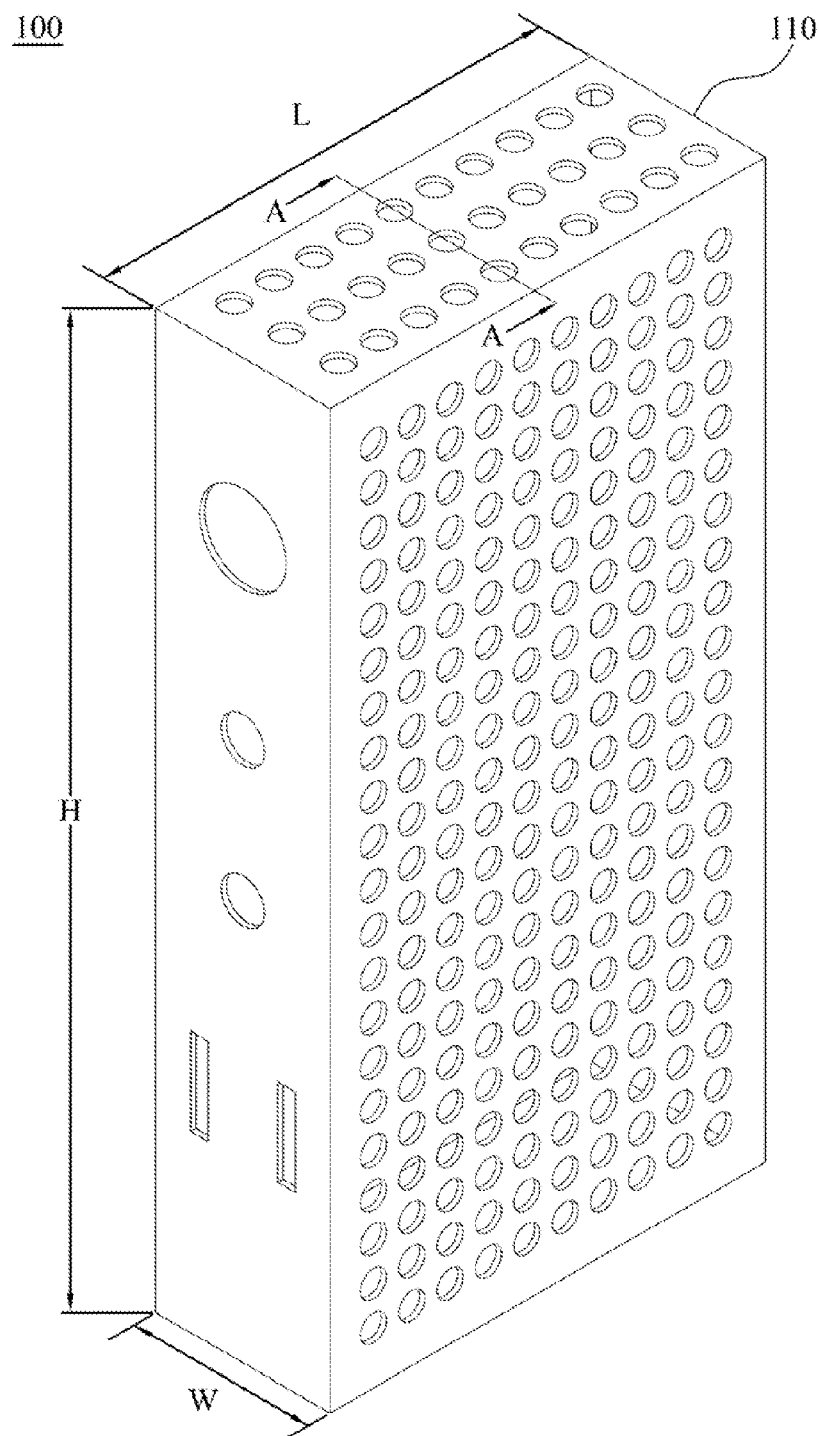
FIG. 1 is a schematic perspective view of an electronic device according to some embodiments of this disclosure.
Figure 2:
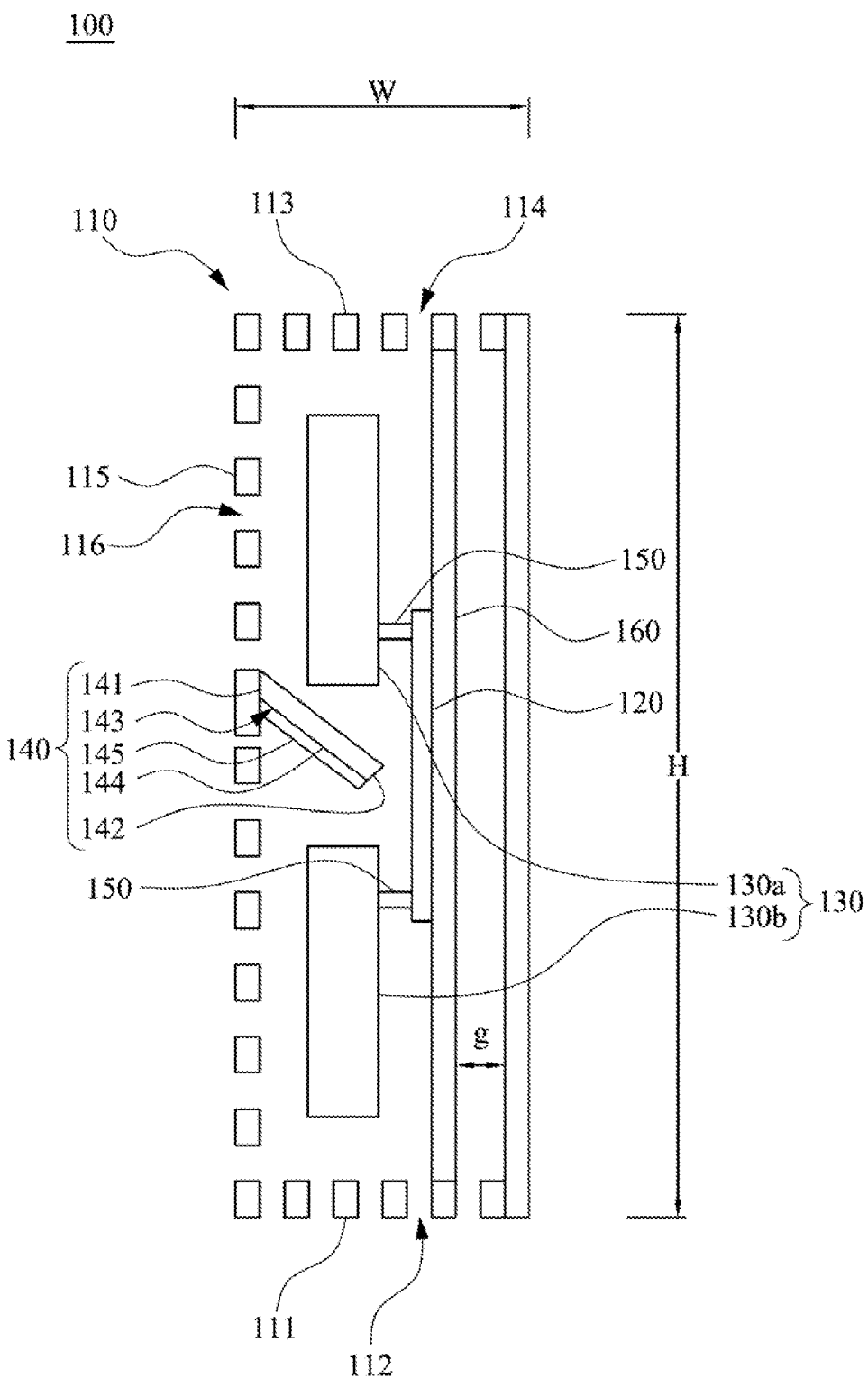
FIG. 2 is a cross-sectional view taken along a segment A-A of FIG. 1.

FIG. 1 is a schematic perspective view of an electronic device 100 according to some embodiments of this disclosure. FIG. 2 is a cross-sectional view taken along a segment A-A of FIG. 1. As shown in FIG. 1 and FIG. 2, the electronic device 100 includes a case 110, a control module 120, a plurality of heat sinks 130, and at least one airflow guiding structure 140. The case 110 includes a bottom plate 111, a top plate 113, and at least one side plate 115. The bottom plate 111 has a plurality of bottom holes 112 for guiding air to an interior of the case 110. The top plate 113 has a plurality of top holes 114 for exhausting air inside the case 110. The side plate 115 connects the top plate 113 and the bottom plate 111 and has a plurality of side holes 116 for exhausting air inside the case 110. The control module 120 is disposed in the case 110. The heat sinks 130 are disposed in the case 110 and are thermally connected to the control module 120. The airflow guiding structure 140 is disposed between the heat sinks 130 for guiding a part of the air inside the case 110 to be exhausted through the side holes 116.

The control module 120 may be a central processing unit (CPU) or a microprocessor (uP). People having ordinary skill in the art can make proper modification to the control module 120 according to their actual needs.

The heat sinks 130 include a heat sink 130a disposed in an upper half interior space of the case 110 and a heat sink 130b disposed in a lower half interior space of the case 110, A long side of each of the heat sinks 130a and 130b is perpendicular to the bottom plate 111, and the long side of each of the heat sinks 130a and 130b is parallel to a movement direction of a rising airflow, such that the hot rising airflow passes interspaces in each of the heat sinks 130a and 130b.

The electronic device 100 may further include a plurality of heat pipes 150, and the heat sinks 130a and 130b are thermally connected to the control module 120 via the heat pipes 150. People having ordinary skill in the art can make proper modification to the electronic device 100 according to their actual needs.

Figure 3:
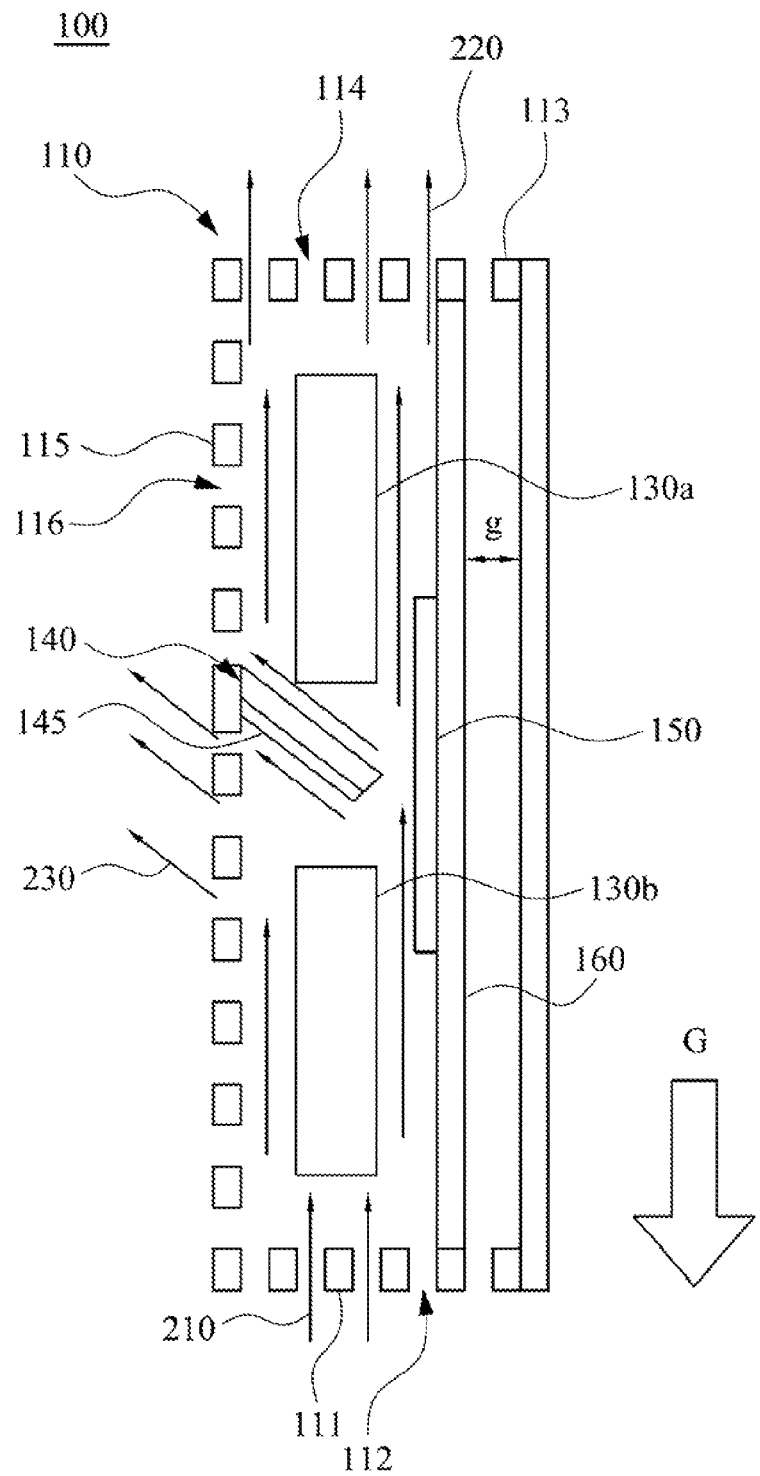
FIG. 3 is a schematic cross-sectional view illustrating airflows in the electronic device of FIG. 2.

FIG. 3 is a schematic cross-sectional view illustrating airflows in the electronic device 100 of FIG. 2. As shown in FIG. 2 and FIG. 3, when the control module 120 is operating, a temperature of the control module 120 may rise. To prevent the control module 120 from being overheated, the control module 120 may dissipate heat to the heat sinks 130a and 130b via heat pipes 150.

Because the control module 120 and the heat sinks 130a and 130b dissipate the heat to an ambient air, especially the heat sinks 130a and 130b, for large surface areas of the heat sinks 130a and 130b contacting the ambient air, the ambient air may thermally expand due to a rising temperature. Therefore, a buoyant force of the ambient air may be larger than a gravitational force of the ambient air, such that the ambient air may rise, and the ambient air rises to the top plate 113, such that the ambient air leaves the case 110 through the top holes 114 and that an airflow 220 is formed.

Due to the aforementioned effect, an air pressure of the interior of the case 110 may be smaller than an air pressure of the exterior of the case 110, and the air in the exterior of the case 110 may flow into the interior of the case 110 through the bottom holes 112, such that an airflow 210 is formed. Because the airflow 210 flows from the exterior of the case 110, a temperature of the airflow 210 may be a room temperature and be lower than a temperature of the control module 120. Therefore, the control module 120 and the heat sinks 130a and 103b may dissipate the heat to the new ambient air of the control module 120 and the heat sinks 130a and 130b coming from the exterior of the case 110, and the aforementioned heat-dissipating process may be repeated.

Because the airflow guiding structure 140 is disposed between the heat sinks 130a and 130b, a part of the airflow 210 may be guided by the airflow guiding structure 140 and flows toward the side plate 115, and then the part of the airflow 210 may leave the case 110 to form an airflow 230. Because a source of the airflow 230 is the airflow 210 passing at least one heat sink (130b here), a part of the heat of the heat sinks 130a and 130b may be dissipated by the airflow 230.

The airflow 210 flows into the interior of the case 110 from the exterior of the case 110 through the bottom holes 112. Then, when the airflow 210 contacts the heat sinks 130a and 130b and the control module 120, the heat of the heat sinks 130a and 130b and the control module 120 is absorbed by the airflow 210. Then, the part of the heat is dissipated to the exterior of the case 110 by the airflow 220 passing the top holes 114, and the other part of the heat is dissipated to the exterior of the case 110 by the airflow 230 passing the side holes 116. Because not all the heat is dissipated to the exterior of the case 110 through the top holes 114, a temperature of the top plate 113 may not be higher than a standard.

Because the airflow guiding structure 140 is disposed between the heat sinks 130a and 130b, most of the heat dissipated by the airflow 230 guided by the airflow guiding structure 140 is from the heat sink 130b, and most of the heat dissipated by the airflow 220 is from the heat sink 130a and 130b.

As shown in FIG. 1, the case 110 is cubic, and a height H of the case 110 is greater than a length L or a width W of the case. A direction of the height H is parallel to a direction of the gravitational force. People having ordinary skill in the art can make proper modification to the case 110 according to their actual needs.

The electronic device 100 may be a thin client. People having ordinary skill in the art can make proper modification to the electronic device 100 according to their actual needs.

As shown in FIG. 2, the airflow guiding structure 140 is a baffle. The material of the airflow guiding structure 140 may have good thermal conductivity, and the material of the airflow guiding structure 140 may be a metal such as copper or aluminum. In some embodiments, the airflow guiding structure 140 and the side plate 115 are integrally molded.

The airflow guiding structure 140 may have a first end 141 and a second end 142 opposite to the first end 141, the first end 141 neighbors with the side plate 115, the second end 142 is disposed between the heat sinks 130a and 130b, and an angle between the airflow guiding structure 140 and the side plate 115 is from 10 to 80 degrees or from 50 to 60 degrees, so as to exhaust the air efficiently.

The electronic device 100 may further include a motherboard 160 vertically disposed in the case 110, and the control module 120 is disposed on the motherboard 160. Specifically, a gap g is between the motherboard 160 and the side plate 115, such that airflows may flow around the motherboard 160.

The airflow guiding structure 140 may include a body 143 and a phase change material microcapsule layer 145. The body 143 has a bottom surface 144 facing the bottom plate 111, and the phase change material microcapsule layer 145 totally covers or is coated on the bottom surface 144.

Figure 4:
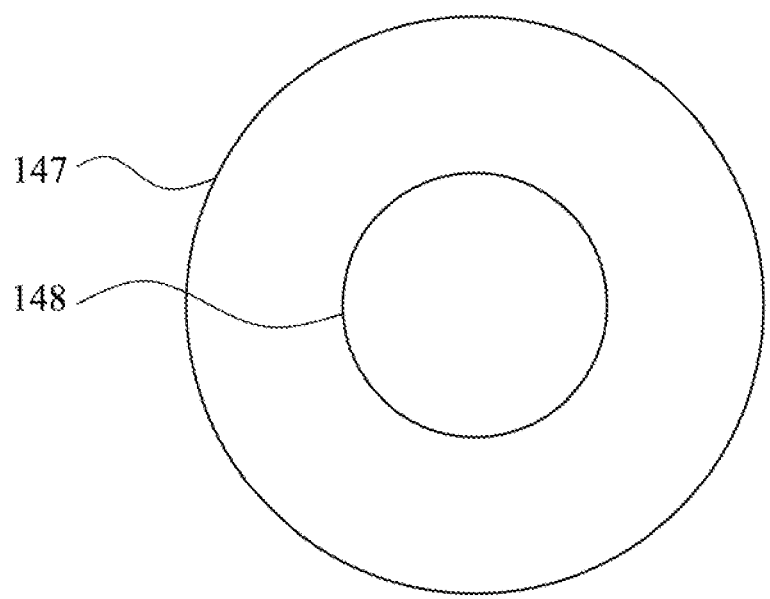
FIG. 4 is a cross-sectional view of a phase change material microcapsule according to some embodiments of this disclosure.

FIG. 4 is a cross-sectional view of a phase change material microcapsule 146 according to some embodiments of this disclosure. The phase change material microcapsule layer 145 may include a plurality of phase change material microcapsules 146. As shown in FIG. 4, each of the phase change microcapsules 146 includes a capsule shell 147 and a capsule core 148. The material of the capsule shell 147 is high polymers, and the material of the capsule core 148 is a phase change material. When the airflow guiding structure 140 is guiding the airflow 230 (shown in FIG. 3), a temperature of the airflow 230 may be high. The phase change microcapsules 146 may absorb a part of the heat in the airflow 230, and the temperatures of the airflow guiding structure 140 and the airflow 230 are stabilized.

A melting point of the capsule core 148 may approximately equal to the temperature of the airflow 230 when the electronic device 100 is operating. The melting point of the capsule core 148 is from 20° C. to 75° C. or from 35° C. to 55° C.

When the electronic device 100 is not operating, the temperature of the capsule core 148 is smaller than the melting point of the capsule core 148, so the capsule core 148 is in a solid state. When the electronic device 100 is operating, sometimes the temperature of the control module 120 may be too high, such that the temperatures of the heat sinks 130 and the airflow 230 may rise as well. When the airflow 230 contacts the phase change material microcapsule layer 145, a melting of the capsule core 148 absorbs the part of the heat in the airflow 230, so as to stabilize the temperatures of the airflow guiding structure 140 and the airflow 230.

The material of the capsule core 148 may be a heat absorbing material such as paraffins or alkanes (eicosane to triacotane, for example), alcohols (n-decyl alcohol to eicosanol, for example), or acids (n-decylic acid to eicosanoic acid, for example), People having ordinary skill in the art can make proper modification to the material of the capsule core 148 according to their actual needs.

The material of the capsule shell 147 is a mixture of polycarbonate and glass fiber. People having ordinary skill in the art can make proper modification to the material of the capsule shell 147 according to their actual needs.

By disposing the airflow guiding structure 140 between the heat sinks 130, the part of the air in the interior of the case 110 are guided to the exterior of the case through the side holes 116, so that not all the hot air is exhausted through the top holes 114. Therefore, the temperature of the top plate 113 may not be higher than the standard.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 §112, 6th paragraph. In particular, the use of "step of" in the claims herein is not intended to invoke the provisions of 35 U.S.C. §112, 6th paragraph.

What is claimed is:

1. An electronic device, comprising:
    a case, comprising:
        a bottom plate having a plurality of bottom holes for guiding an air to an interior of the case;
        a top plate having a plurality of top holes for exhausting the air inside the case; and
        at least one side plate connecting the top plate and the bottom plate and having a plurality of side holes for exhausting the air inside the case;
    a control module disposed in the case;
    a plurality of heat sinks disposed in the case and thermally connected to the control module; and
    at least one airflow guiding structure disposed between the heat sinks for guiding a part of the air inside the case to be exhausted through the side holes, the airflow guilding structure comprising;
        a body having a bottom surface facing the bottom plate; and
        a phase change material microcapsule layer totally covering or coated on the bottom surface.

2. The electronic device of claim 1, wherein the case is rectangular, and a height of the case is greater than a length or a width of the case.

3. The electronic device of claim 1, wherein the airflow guiding structure is a baffle.

4. The electronic device of claim 1, wherein the airflow guiding structure has a first end and a second end opposite to the first end, the first end neighbors with the side plate, the second end is disposed between the heat sinks, and an angle between the airflow guiding structure and the side plate is from 10 to 80 degrees.

5. The electronic device of claim 1, wherein the phase change material microcapsule layer comprises a plurality of phase change material microcapsules, each of the phase change microcapsules comprises a capsule shell and a capsule core, a material of the capsule shell is high polymers, and a material of the capsule core is a phase change material.

6. The electronic device of claim 5, wherein a melting point of the capsule core is from 20° C. to 75° C.

7. The electronic device of claim 5, wherein a melting point of the capsule core is from 35° C. to 55° C.

8. The electronic device of claim 5, wherein the material of the capsule shell is a mixture of polycarbonate and glass fiber.

9. The electronic device of claim 5, wherein the material of the capsule core is paraffins, alkanes, alcohols or acids.

\* \* \* \* \*